US008411508B2

(12) United States Patent
Kalavade et al.

(10) Patent No.: US 8,411,508 B2
(45) Date of Patent: Apr. 2, 2013

(54) AUTOMATIC SELECTIVE SLOW PROGRAM CONVERGENCE

(75) Inventors: Pranav Kalavade, San Jose, CA (US); Krishna K. Parat, Palo Alto, CA (US); Paul D. Ruby, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 789 days.

(21) Appl. No.: 12/573,579

(22) Filed: Oct. 5, 2009

(65) Prior Publication Data
US 2011/0080789 A1 Apr. 7, 2011

(51) Int. Cl.
*G11C 11/34* (2006.01)
(52) U.S. Cl. .......... 365/185.22; 365/185.03; 365/185.24
(58) Field of Classification Search ............ 365/185.09, 365/185.02, 185.03, 185.17, 185.22, 185.2, 365/185.24, 185.33
See application file for complete search history.

(56) References Cited

U.S. PATENT DOCUMENTS

2003/0214852 A1* 11/2003 Chang ........................... 365/200
2009/0244980 A1* 10/2009 Seol et al. ................. 365/185.22
2009/0290426 A1* 11/2009 Moschiano et al. ..... 365/185.22

* cited by examiner

*Primary Examiner* — Richard Elms
*Assistant Examiner* — Hien Nguyen
(74) *Attorney, Agent, or Firm* — Schwegman, Lundberg & Woessner, P.A.

(57) ABSTRACT

Apparatus, methods, and systems are disclosed, including those to improve program voltage distribution width using automatic selective slow program convergence (ASSPC). One such method may include determining whether a threshold voltage (Vt) associated with a memory cell has reached a particular pre-program verify voltage. In response to the determination, a voltage applied to a bit-line coupled to the memory cell may be automatically incremented at least twice as the program voltage is increased, until the cell is properly programmed. Additional embodiments are also described.

23 Claims, 8 Drawing Sheets

AUTOMATIC SELECTIVE SLOW PROGRAM CONVERGENCE

BACKGROUND

Nonvolatile memory, including flash memory devices, may be used in personal computers, personal digital assistants (PDAs), digital cameras, and cellular telephones to store program code and system data, such as a basic input/output system (BIOS).

BRIEF DESCRIPTION OF THE DRAWINGS

The various embodiments are illustrated by way of example and not limitation in the following figures, in which.

DETAILED DESCRIPTION

In general, some memory devices may use a one-transistor memory cell design that facilitates high memory densities, high reliability, and low power consumption. In some cases, Multi-Level memory Cells (MLCs) may be used in memory devices to further increase density. To provide good performance in an MLC device, it may be useful to reduce the program gate step size to reduce the program threshold voltage (Vt) distribution width. Reducing the program gate step size may also reduce the cell programming time performance.

Various apparatuses and methods that improve the balance between program threshold voltage (Vt) distribution width and program time will now be described.

During a programming operation, various embodiments may operate to determine that the voltage Vt associated with an individual memory cell has reached a particular pre-program verify (PPV) voltage. In response to this determination, a voltage applied to a digit line, such as a bit-line (BL), coupled to the selected memory cell may be incremented. That is, the voltage applied to the digit line will be incremented without determining whether the threshold voltage has reached some other pre-program verify voltage (PPV).

Selective slow program convergence (SSPC) may be used to attain improvement in the program threshold voltage (Vt) distribution width. Referring to FIG. 1A, once a cell approaches a particular target threshold voltage (Vt) 10 and passes the pre-program verify (PPV) voltage 12, a small voltage may be applied to the bit line (BL), which causes the programming of the cell to slow down during the pair of pulses 14. A further reduction in the program threshold voltage (Vt) distribution width may be achieved by adding another level of selective slow program convergence (SSPC) as shown in FIG. 1B. Accordingly, two (or multiple) pre-verify levels, including a first pre-verify level (PPV1) and a second pre-verify level (PPV2) may be employed. Pre-verifying the cell will, however, require an additional verify operation, which may cause programming time to be extended.

In various embodiments, increasing the BL bias voltage may be used to achieve a tight Vt distribution without suffering a significant overall device programming time penalty. This is because the programming of selected cells (those that benefit from an increased programming time) may be slowed down by the incremented application of the BL voltage. Incrementing the BL voltage will automatically help minimize the program time as compared to conventional-SSPC or dual-SSPC methods.

Figure 1:
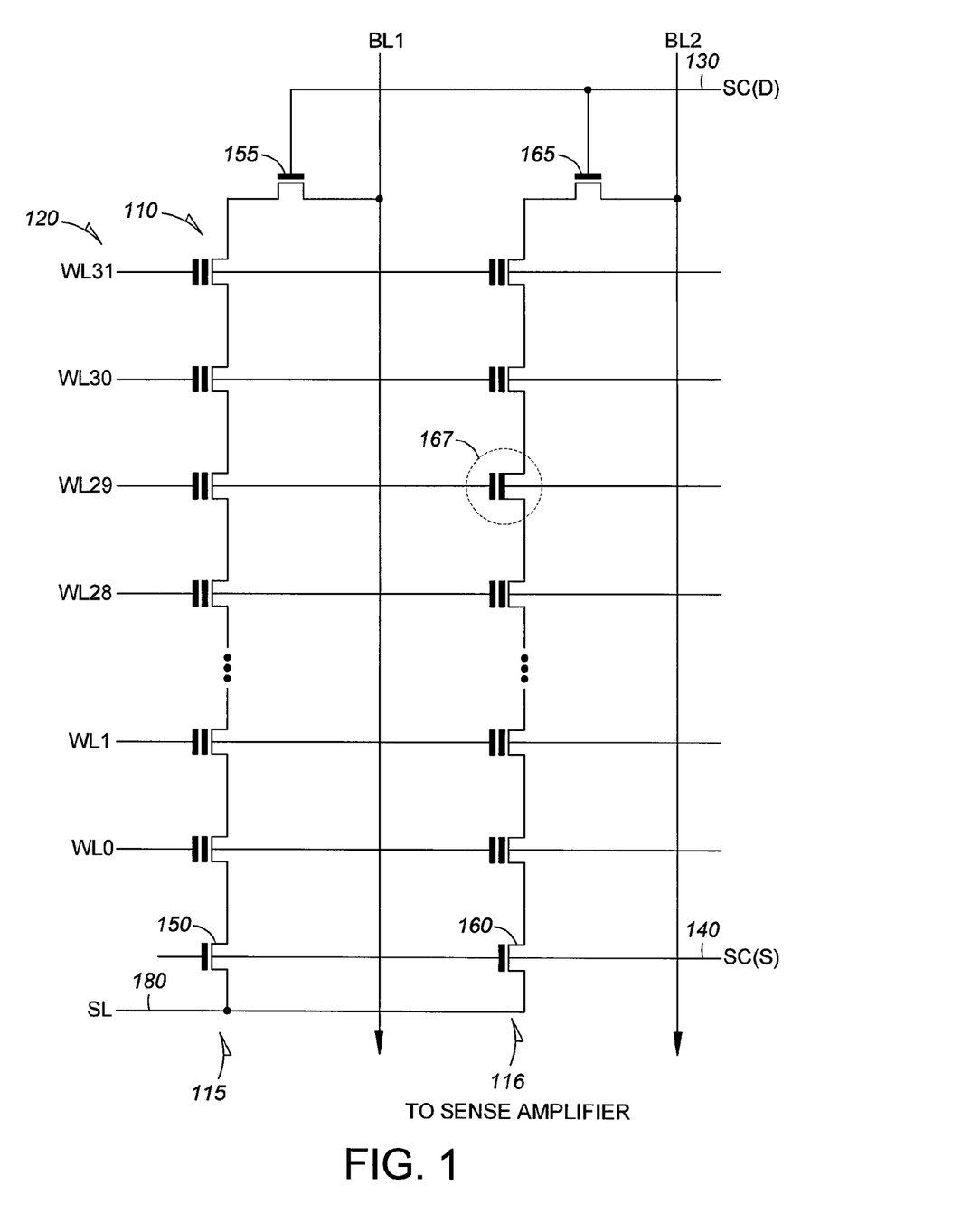
FIG. 1 is a schematic diagram illustrating a memory array, according to various embodiments.
Figure 1A:
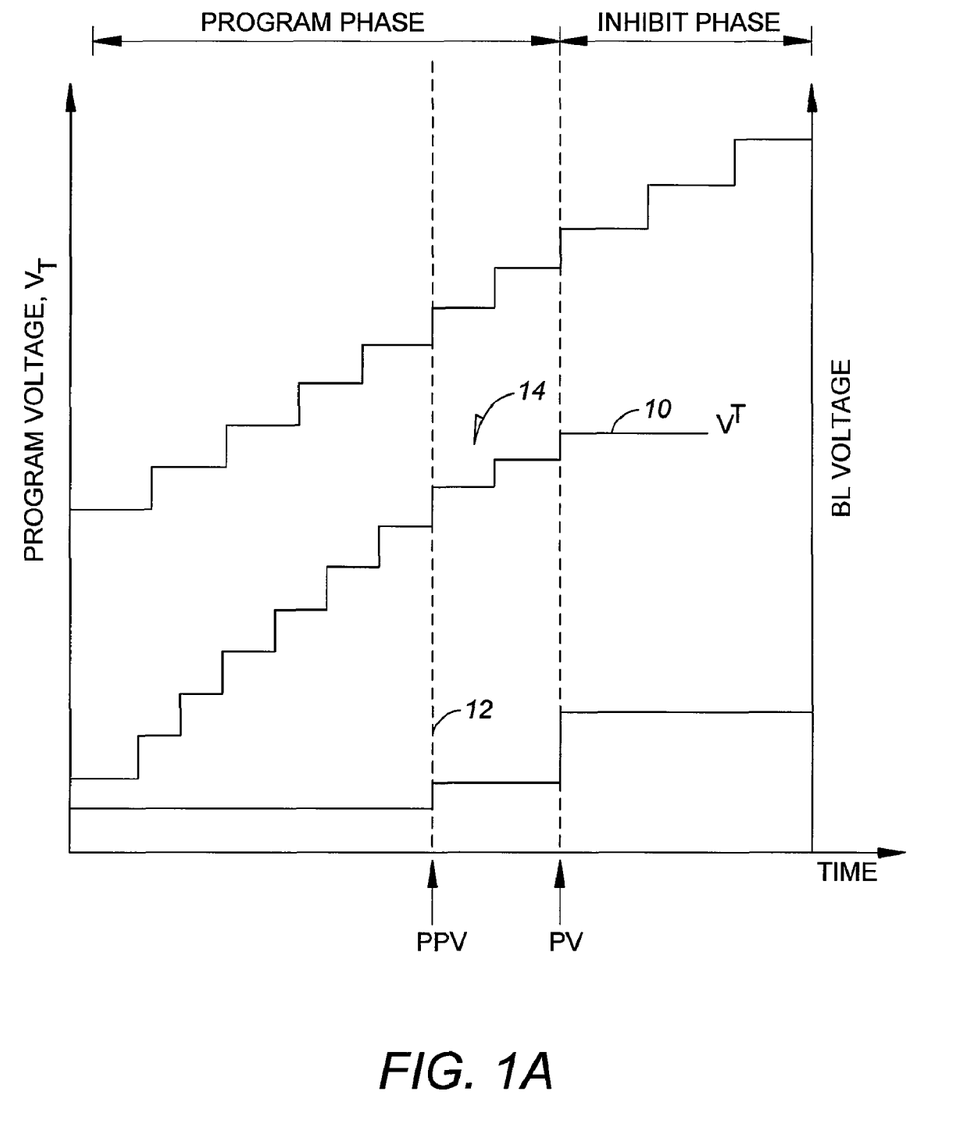
FIG. 1A is a diagram illustrating a program voltage graph, an applied BL voltage graph, and a Vt graph for a flash memory cell programmed using automatic selective slow programming convergence (ASSPC), according to various embodiments.
Figure 1B:
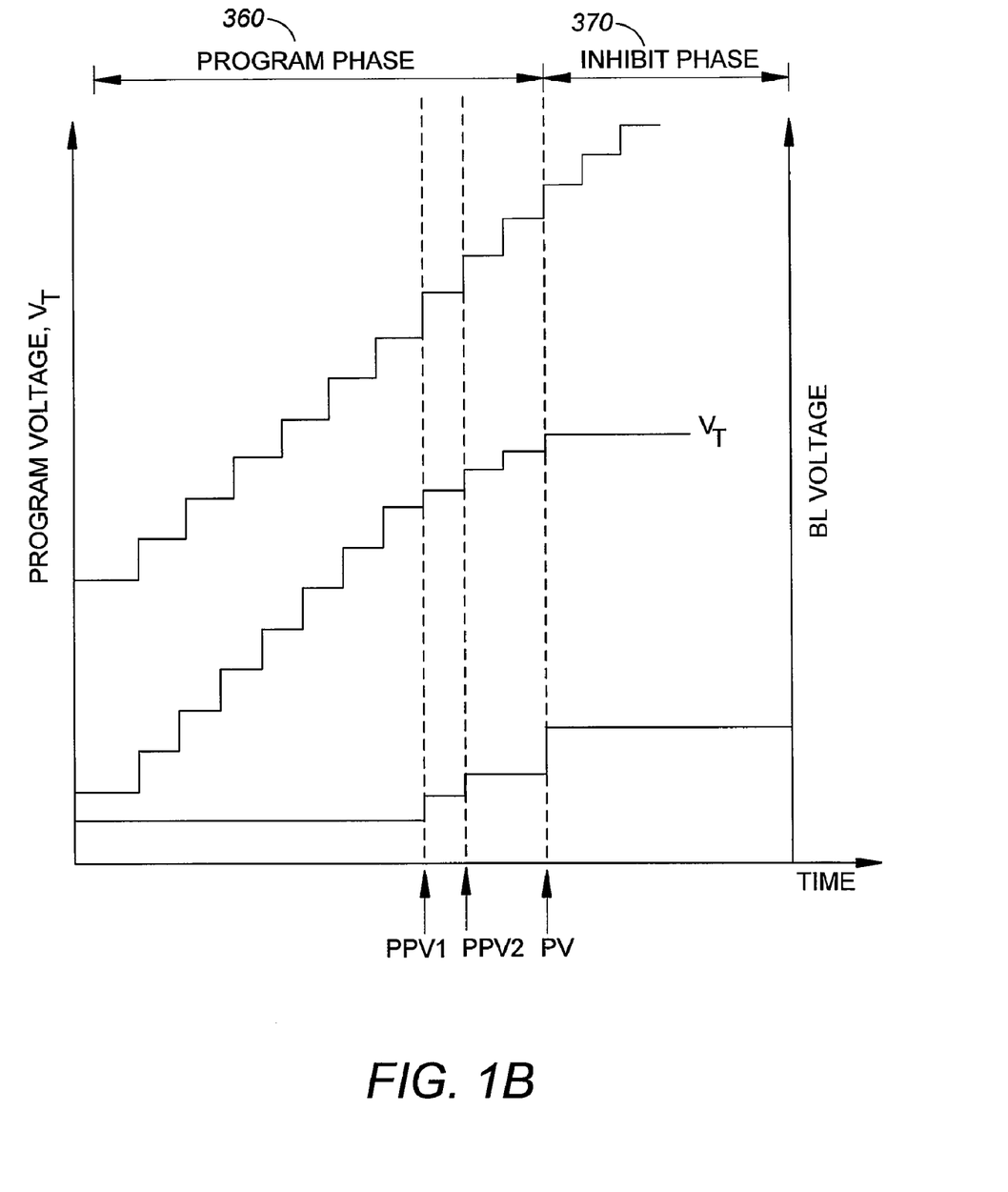
FIG. 1B is a diagram illustrating a program voltage graph, an applied BL voltage graph, and a Vt graph for a flash memory cell programmed using automatic selective slow programming convergence (ASSPC), according to another of the various embodiments.

FIG. 1 is a schematic diagram illustrating a memory array 100, according to the various embodiments. The memory array 100 may comprise a nonvolatile memory array, for example, a flash memory array, such as a portion of a NAND architecture flash memory device. The various embodiments are not limited to any one type of memory array architecture. For example, the various embodiments may also operate in NOR or AND array architectures. The memory array 100, for purposes of clarity, may not show all of the elements typically used in a memory array. For example, only two bit-lines (BLs) are shown in FIG. 1 (e.g., BL1 and BL2), whereas the number of BLs that may be used may generally depend upon the memory density, and consequently may be quite large. In the present discussion, the BLs will be subsequently referred to herein as (BL1-BLN).

The memory array 100 may comprise an array of memory cells, such as floating gate memory cells 110, arranged in a series of chains, such as columns 115 and 116. Each of the floating gate memory cells 110 may be coupled drain-to-source to form the columns 115 and 116. Each access line, such as word lines (WL0-WL31) spans multiple chains, such as the columns 115 and 116, and may be coupled to, or comprise the control gates of every floating gate memory cell 110 in a row in order to control their operation. The BLs (BL1-BLN) may be coupled to sense circuitry, such as sense amplifiers (not shown) that may detect the programmed state (e.g., a binary logic state such as 0 or 1) of each cell.

In operation, the word lines (WL0-WL31) may select the individual floating gate memory cells in the columns 115 and 116 to be written to or read from and operate the remaining floating gate memory cells 110 in each of columns 115 and 116 in a pass-through mode. The array columns of the floating gate memory cells 110, such as columns 115 and 116, may be coupled to a source line (SL) 180 by source select switches 150 and 160, and to individual BLs (BL1-BLN) by drain select switches 155 and 165. The source select switches 150 and 160 may be controlled by a source select control line SC(S) 140 that may be coupled to gate contacts of the source select switches 150 and 160. The drain select switches 155 and 165 may be controlled by a drain select control line SC(D) 130.

In a memory programming operation, the selected word line for the flash memory cell 110 may be biased with a series of incrementing voltage programming pulses (or an incrementing pulse width) that may start at an initial voltage greater than a programming voltage (e.g., approximately 16V, for example). After each programming voltage pulse, a verification operation with a word line voltage of 0V may be performed to determine whether the voltage Vt of the memory cell has increased to a desired programmed level (e.g., 0.5V, for example).

The unselected word lines of the remaining cells may be biased at a voltage that is less than the programming voltage (e.g., approximately 10V, for example) during the program operation. Each of the memory cells of the memory array 100 may be programmed in a similar fashion.

Figure 2:
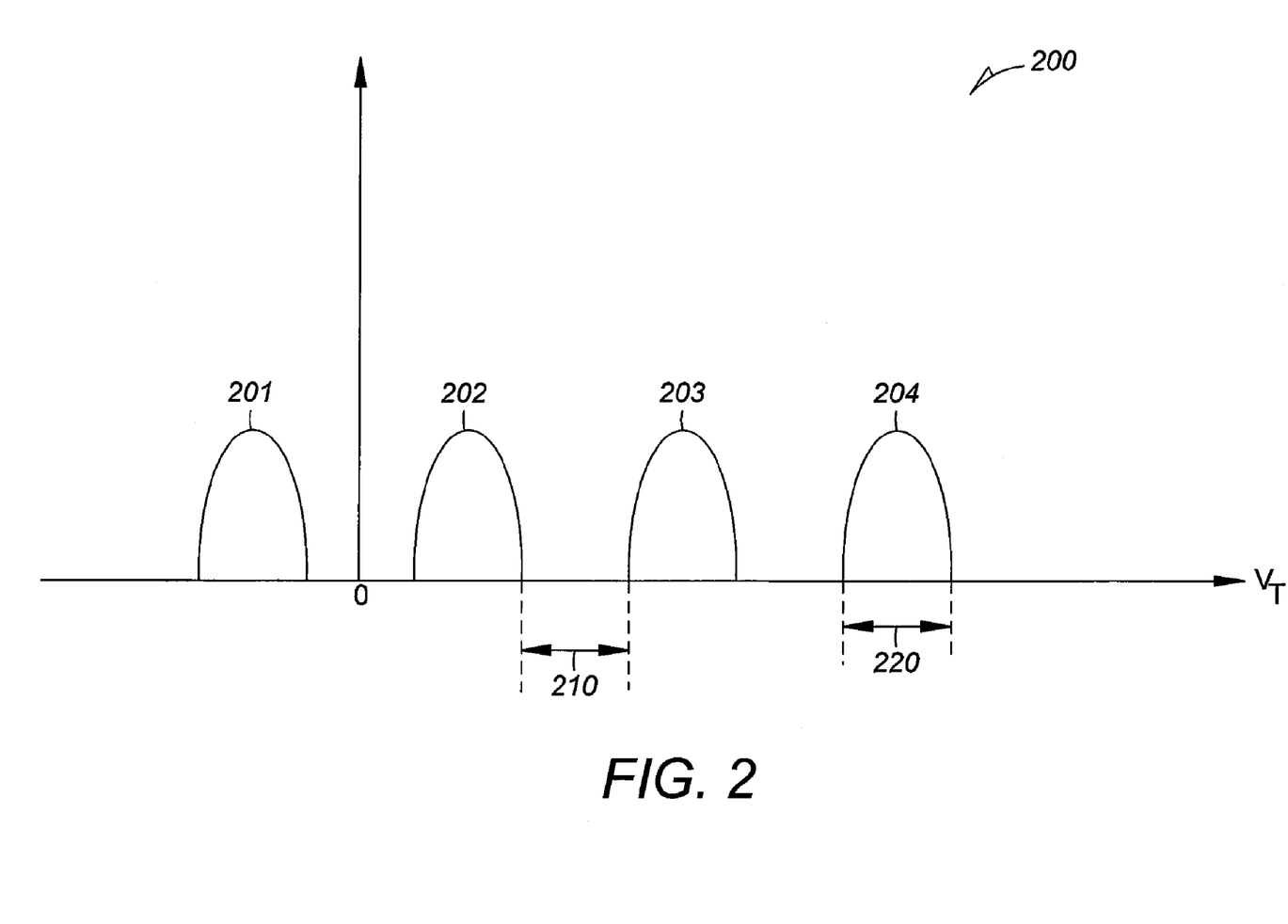
FIG. 2 is a diagram illustrating a threshold voltage (Vt) distribution for an MLC device, in this case a 4-level flash memory cell device, according to various embodiments.

FIG. 2 is a diagram illustrating Vt distributions 200 for an MLC device, which may include four-level flash memory cells, according to the various embodiments. Memory cells of a NAND array architecture, which may be included in the memory array 100 of FIG. 1, may be configured (e.g., programmed) to achieve a desired program state. For example, an electric charge may be placed on or removed from the floating gate of a memory cell to program the memory cell into a number of stored states. For example, a single level cell (SLC) may represent two binary logic states, e.g., 1 or 0.

Flash memory cells may store more than two bits of data in multiple states. Memory cells with more than two stored states may be generally referred to as MLC devices, multi-bit cells, or multi-state cells. MLC devices may thus allow the manufacture of higher density memories without increasing the number of memory cells since each cell can represent more than one bit. MLCs may have more than one programmed state (a cell capable of representing four bits can have fifteen programmed states and an erased state, for example). For example, FIG. 2 shows four states of a memory device having four-level memory cells. Three of the states may comprise programmed states "10", "00", and "01", respectively, corresponding to Vt distributions 202, 203, and 204 shown in FIG. 2. A Vt distribution 201, at negative threshold voltages, may represent an erased state "11."

The Vt distributions 201-204 shown in FIG. 2 may represent statistical distributions of the measured threshold voltages for a large number of memory cells. When increasing the number of storage levels in a memory cell, other design considerations (for example, data reliability) may come into play. As the number of storage levels in a memory cell increase, the gap 210 between $V_t$ distributions may decrease due to limitations in applying higher voltages. As a result, the memory device may be susceptible to various data corruption mechanisms. For example, corruption mechanisms in NAND flash memories may include thermal noise, random telegraph signaling (also known as burst noise), cycle fatigue resulting from repeated program/erase cycles, and disturbances due to read and write operations in adjacent cells. Although digital error correction and detection may be used to overcome the reliability issues resulting from some of the foregoing corruption mechanisms, data reliability may also be enhanced if the distribution width 220 of stored states can be reduced. For example, this reduction may operate to improve the cell data reliability by providing a larger gap 210 between stored states 202-204.

Although the programmed states shown in FIG. 2 comprise only three states, the various embodiments are not so limited, and may include MLC devices with different numbers of programmed states. Also, the disclosed methods are not limited to multi-level flash memory cells and may be applied to other types of MLCs.

Figure 3:
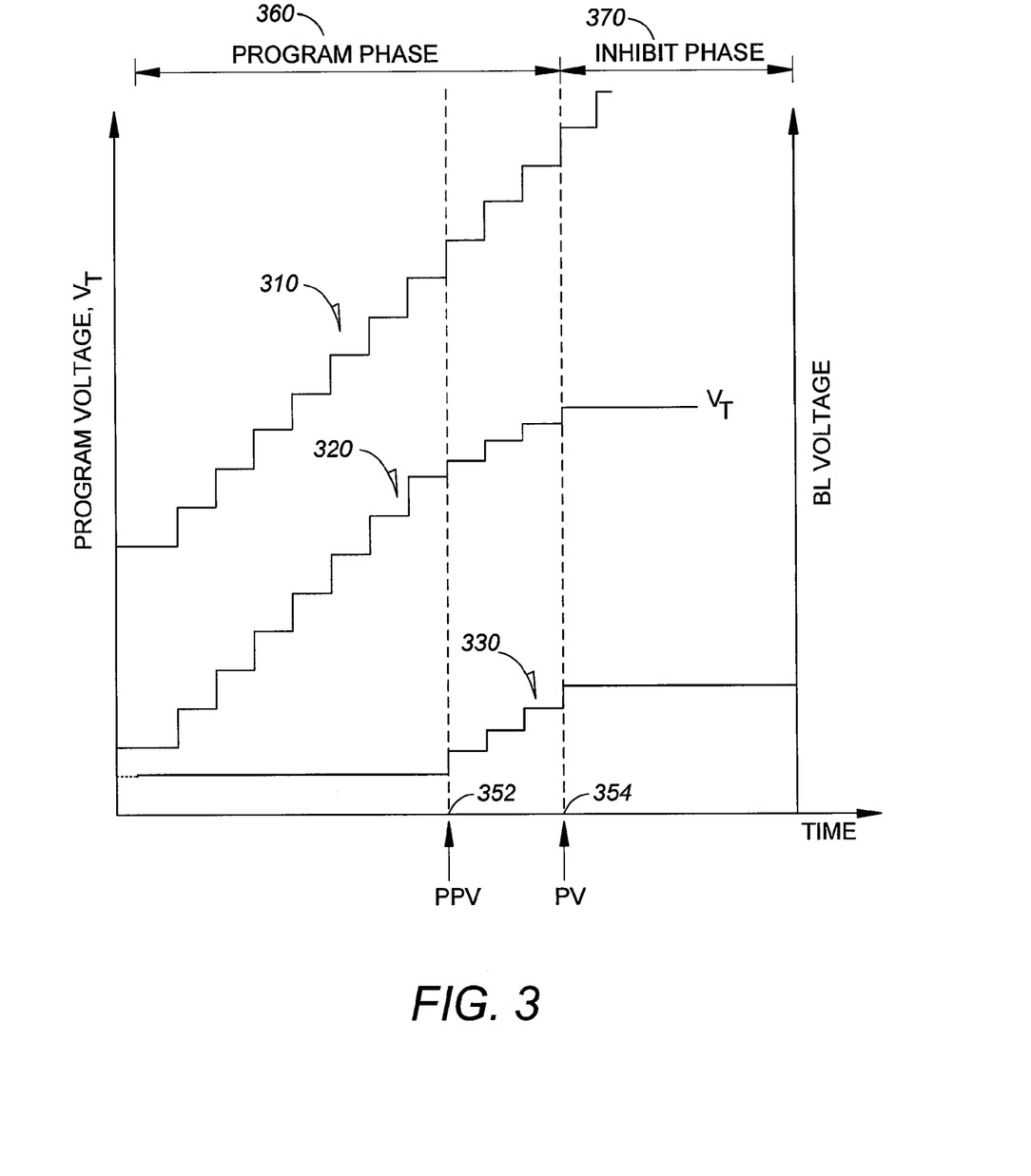
FIG. 3 is a diagram illustrating a program voltage graph, an applied BL voltage graph, and a Vt graph for a flash memory cell programmed using automatic selective slow programming convergence (ASSPC), according to still another of the various embodiments.

FIG. 3 is a diagram illustrating a program voltage graph 310, an applied BL voltage graph 330, and a Vt graph 320 for a flash memory cell programmed using ASSPC, according to the various embodiments. The program voltage pulses shown by the program voltage graph 310 may be applied to one of the WLs 120 of FIG. 1 connected to a memory cell of the memory array 100 (e.g., memory cell 167 of FIG. 1) that is designated for a data write operation. In the various embodiments, the program voltage pulses as shown in program voltage graph 310 may comprise a series of voltage pulses having incrementally increasing pulse heights and may have identical pulse widths, although other pulses may also be used.

Still referring to FIG. 3, and also again to FIGS. 1-2, it may be seen that the program voltage pulses in the program voltage graph 310 may start at an initial pulse height (e.g., approximately 16 volts) and increase in increments having a predetermined height (e.g., approximately 0.5 volt). The height increments of the program voltage pulses in the program voltage graph 310 may be initially followed by substantially identical changes in the voltage Vt of the memory cell 167 as shown by the graph 320. A program target may be set to increase the voltage Vt to a selected value within a range of Vt values corresponding to desired programmed state (e.g., stored state 203, as shown in FIG. 2). A program verify (PV) point 354 may designate such an instance in the program phase 360 of the memory cell 167, which may indicate when the Vt has reached that value within the range of Vt values corresponding to the desired programmed state. At the PV point 354, it may be determined that the Vt voltage has increased to the selected PV voltage. The selected PV voltage may comprise a Vt value that is within the Vt range of the desired programmed state, for example the programmed state 203, shown in FIG. 2. The determination may comprise sensing the memory cell 167, via a sense amplifier coupled to BL2 of FIG. 1, and comparing the content of the memory cell with a desired value (e.g., the PV voltage).

The ASSPC method may be used to decrease (i.e., tighten) the Vt distribution width (e.g., a width of the programmed state 203) of an MLC device in the various embodiments. The Vt voltage distribution width may be tightened by using program voltage pulses 310 with smaller programming increments. However, using smaller programming increments may degrade the programming performance, since it may take more time to program the memory cell. For example, one way to keep the programming increment unchanged while reducing its effect on the voltage Vt, may include applying a carefully designed voltage to the BL coupled to the cell being programmed. This may reduce the voltage drop across the memory cell transistor, which in turn, may reduce the effective programming voltage applied to the memory cell 167.

Thus, at a selected PPV point 352, the BL voltage pulses shown in the BL voltage graph 330 may be applied to the BL2 of FIG. 1, which may be coupled to the column 116 of FIG. 1, including the memory cell 167. The PPV point 352 may be associated with a PPV voltage that is close to the PV voltage. Accordingly, the PPV point 352 may be an indication that the Vt of the memory cell 167 is approaching the PV voltage. As shown by the BL voltage graph 330, when starting at a PPV point 352, the voltage applied to the BL2 may be automatically incremented in particular increments (e.g., approximately 0.25 volt) until the PV point 354 is reached. In general terms, this may include incrementing the BL voltage multiple times in response to the Vt level reaching a single PPV. The Vt graph 320 shows that the incremented values of the voltage Vt may have been reduced after the PPV point 352 is reached.

The reduction in incremented values of the Vt voltage may result in finer movements towards the target PV voltage. At PV point 354, when the Vt reaches the target PV voltage, the programming of the memory cell 167 may enter an additional phase (e.g., an inhibit phase 370). In the inhibit phase 370, the BL voltage applied to the BL2 may be set to a program inhibit voltage ($V_{inhibit}$) value, whereas the program voltage pulses shown in graph 310 may continue to rise in value to allow for continued programming of other memory cells connected to the same WL (i.e., WL29). The program voltage pulses and the BL voltage may be controlled by the control circuitry 430 shown in FIG. 4, and as described in further detail below.

Figure 4:
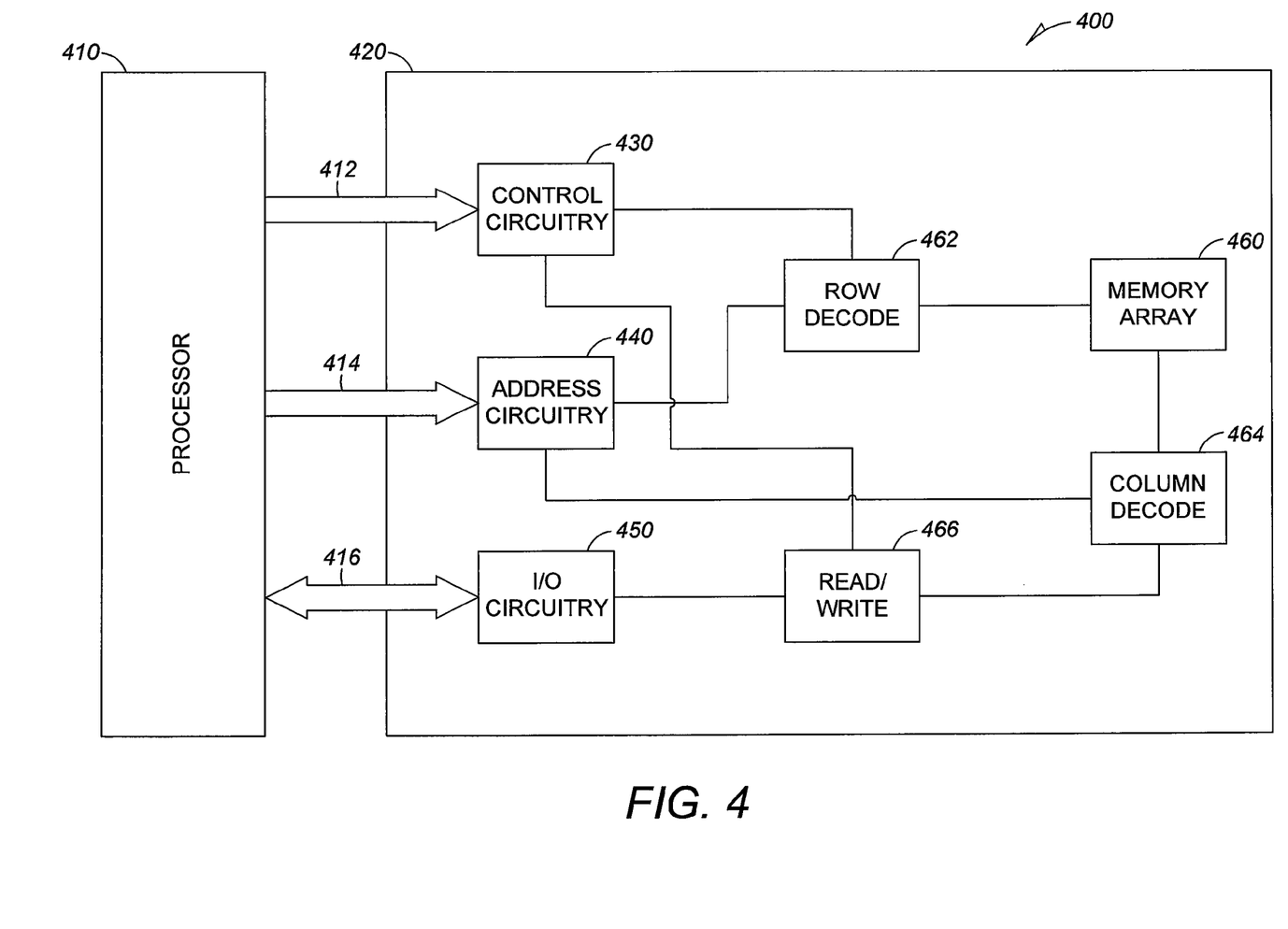
FIG. 4 is a block diagram illustrating a system for programming flash memory cells using ASSPC, according to various embodiments.

FIG. 4 is a block diagram illustrating a system 400 for programming flash memory cells using a method, according to various embodiments. The system 400 may include one or more memory devices 420 that may be coupled to a processor 410. The one or more memory devices 420 may comprise a nonvolatile memory device such as the memory array 460 (e.g., a memory array similar to the array 100 shown in FIG. 1). The processor 410 may comprise a microprocessor, a controller, or other controlling circuitry. The memory device 420 and the processor 410 may form at least a part of an electronic system 400, such as a laptop or desktop computer, a cell phone, a personal digital assistant (PDA), a camera, or other similar devices. The system 400 and memory device 420 may have any number of additional components not shown in FIG. 4. Accordingly, FIG. 4 has been simplified to specifically focus on features of the memory device 420.

Address buffer circuitry 440 may be provided to latch address signals provided on address input connections 414. The address signals may be received and decoded by a row decoder 462 and a column decoder 464 to access the memory array 460. The number of address input connections may depend on the density and architecture of the memory array 460 and, for example, may increase with an increased number of memory cells in the memory array 460.

The memory device 420 may read data in the memory array 460 by sensing voltage or current changes in the memory array columns using read/write circuitry 466. Data input and output (I/O) buffer circuitry 450 may perform bi-directional data communication over a plurality of data connections 416 with the processor 410. The read/write circuitry 466 may also facilitate writing data to the memory array 460.

Control circuitry 430 may decode signals provided on control connections 412 by the processor 410. These signals may be used to control the operations on the memory array 460, including data read, data write, and erase operations. In the various embodiments, the control circuitry 430 may execute any one or more of the method, or portions of the methods described herein. The control circuitry 430 may comprise a state machine, a sequencer, or other suitable controller circuitry. The system 400 may comprise any number of devices, as noted previously, including a single memory storage device, such as a flash memory, including a NAND-type or NOR-type flash memory.

Figure 5:
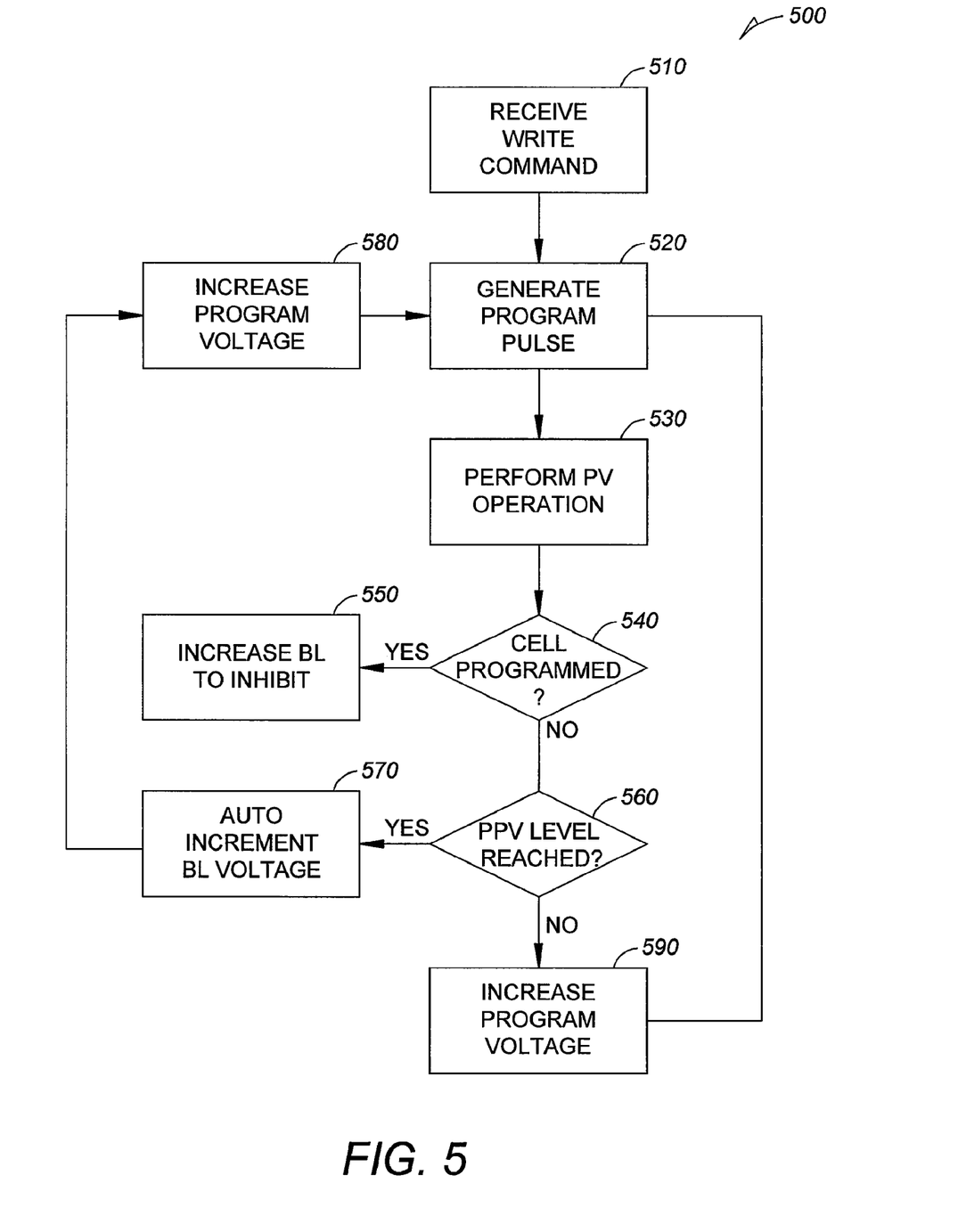
FIG. 5 is a flow diagram illustrating a method of programming flash memory cells using ASSPC, according to various embodiments.

FIG. 5 is a flow diagram illustrating a method 500 of programming flash memory cells using a method, according to various embodiments. Referring also again to FIGS. 1-4, it may be seen that at 510, a write command may be received by the control circuitry 430 of FIG. 4 to write data to one or more memory cells of the memory array 460 (e.g., memory cell 167 of FIG. 1). The data may comprise a single bit or multiple bits that may be represented by one of the program states shown by the Vt voltage distributions of FIG. 2. As previously described, the programming voltage pulses (310) may be generated at 520 and applied to a selected control gate (e.g., the control gate of memory cell 167 shown in FIG. 1).

As part of the program verify at 530, the control circuitry 430 may operate to determine whether the memory cell 167 has been properly programmed, i.e., whether the Vt associated with the memory cell 167 has reached the selected PV voltage. To accomplish this determination as part of decision 540, the control circuitry 430 may perform a read of the memory cell 167 to determine its content and may compare the content against a desired value (such as the PV voltage). When it is determined at decision 540 that the memory cell 167 has been satisfactorily programmed, its drain connection (i.e., the bit line BL2 of FIG. 1 to which the memory cell 167 is connected) may be biased during operation 550 at a program inhibit voltage (e.g., $V_{inhibit}$). In the various embodiments, the $V_{inhibit}$ may comprise $V_{CC}$; however, other suitable values may also be used.

When the control circuitry 430 determines that the memory cell 167 is not yet programmed with the desired data at decision 540, control may pass to decision 560. At decision 560, the control circuitry 430 may operate to check Vt for the memory cell 167 to determine whether it has reached the single PPV voltage level for the desired programmed state (e.g., programmed state 203 of FIG. 2). Each programmed state may have a single associated PPV voltage. When the threshold voltage for that programmed state reaches the associated PPV voltage, at 570, the control circuitry 430 may operate to slow down programming of the memory cell 167. Programming may be slowed down by automatically incrementing the BL voltage in particular increments, as shown by graph 330 in FIG. 3, and the BL (e.g., BL2 shown in FIG. 1) coupled to the memory cell 167. In the various embodiments, the BL voltage may be incremented during a single PPV stage that spans the time from when the Vt reaches the PPV voltage, until the Vt reaches the PV point as shown in FIG. 3. Unlike Dual-SSPC operations, additional pre-verification actions are not needed.

Such a method selectively slows the programming of each memory cell that has passed the PPV point 352 indicated in FIG. 3 to accommodate the desired programmed state being programmed into that memory cell. Other memory cells being programmed may be unaffected by the BL biasing and may be allowed to be programmed at their normal programming speed. Accordingly, the Vt distribution (e.g., Vt distribution 203 of FIG. 2) may be narrowed without significantly reducing the programming throughput.

The PPV voltage associated with the PPV point 352, as illustrated in FIG. 3 and discussed subsequently, may be less than the PV voltage. For example, in the various embodiments, a first programmed state (i.e., "10") may have a PPV voltage of 0.3V and a PV voltage of 0.5V. In accordance with the various embodiments, these and other voltages may be used. For example, the PV voltage may be associated with a measured value of drain current for the memory cell being programmed. Biasing the BL in this way may reduce the voltage drop across the memory cell transistor, thus reducing the effective programming voltage applied to the memory cell. Accordingly, a lower programming voltage may generally include a slower movement of the voltage Vt for that memory cell. For example, the BL bias voltage range may comprise 0.5 to 0.9 volts. The various embodiments are not limited to any one voltage or range of voltages.

After the BL voltage has been incremented at 570, the control circuitry 430 may operate to increase the program voltage during 580 by a program step voltage, and the programming process may repeat by generating another program voltage pulse during 520. For example, the program increment voltage may comprise a 200 mV increment voltage, although the program increment voltage is not specifically limited to value, so that other values may be used.

At decision 560, when it is determined that the voltage Vt has not reached the PPV voltage, the control circuitry 430 may operate to increase the program voltage at 590 by the program increment voltage. The control circuitry 430 may pass control at 520 so that the programming process can repeat until the PPV voltage level is reached. The control circuitry 430 may operate to adjust the BL voltage to slow the programming of the memory cell 167, and the memory cell 167 may be eventually programmed such that the BL voltage is increased to the inhibit voltage.

Figure 6:
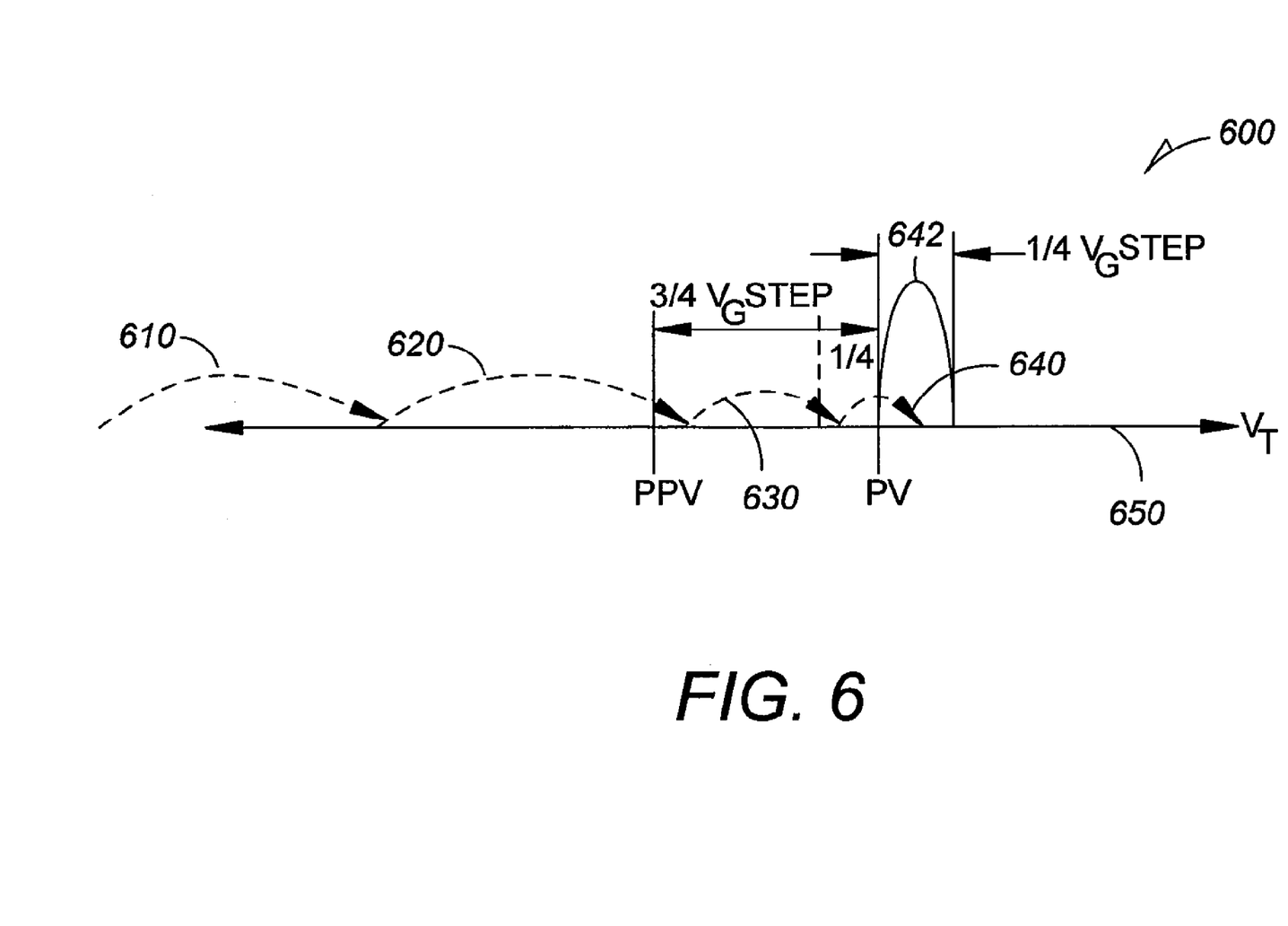
FIG. 6 is a diagram illustrating an ASSPC method, according to various embodiments.

FIG. 6 is a diagram illustrating an ASSPC method 600, according to the various embodiments. The ASSPC method 600 shows the increments in Vt for a programmed memory cell (e.g., memory cell 167 of FIG. 1) as leaps 610-640 across a Vt voltage axis 650. The leaps 610-640 may correspond to Vt steps resulting from application of the program voltage pulses shown by graph 310 of FIG. 3.

The PPV voltage, as shown in FIG. 6, may be smaller than the PV voltage by an amount approximately equal to about three-fourths of a program voltage step (e.g., three-fourths of a voltage Vg step, or 3 Vg/4 in various embodiments). The second leap 620 may take the voltage Vt past the PPV voltage. As a result, the control circuitry 430 of FIG. 4 may operate to automatically increase the BL voltage (e.g., BL2 shown in FIG. 1) in multiple increments. In FIG. 6, the Vt increment (e.g., second leap 620) before PPV is substantially equal to a program step (e.g., one times the voltage Vg step, or Vg, in various embodiments). However, as a result of the increase in the BL voltage by approximately one-half Vg step, the next Vt step, shown as leap 630, is decreased to approximately one-half Vg step (or Vg/2). A subsequent increment in the BL voltage may cause further slowing in the programming operation by reducing the Vt step voltage to about one-fourth Vg step (or Vg/4) at leap 640. This last step has eventually landed the voltage Vt approximately in the middle of the target Vt distribution 642. In various embodiments, the PV voltage may be associated with a measured value of drain current for the memory cell being programmed. The last step change in the voltage Vt may operate to complete the programming of the memory cell 167.

Other memory cells may be programmed in a substantially similar manner. The Vt distribution 642 indicates that the majority of memory cells of the memory array 100 of FIG. 1 may behave similarly to memory cell 167. In other words, the Vt voltage distribution at each point on the Vt voltage axis 650 may indicate the possibility that such a method may operate to distribute the voltage Vt of certain memory cells at that point.

One benefit of the one or more methods discussed herein, as compared to more conventional methods (e.g., selective slow program convergence (SSPC) and Dual SSPC methods), is that such a method may result in a Vt distribution that is reduced by approximately 50% (about half the width) of the Vt distribution in an SSPC method, with fewer program verify stages than the Dual SSPC method. One of many benefits may include rendering the memory array more reliable and facilitate implementing MLCs with more programmed states (i.e. capable of storing more bits). A second benefit (i.e., fewer PPV stages) may include speeding up the programming time of memory cells.

Example methods of improving program voltage distribution using methods according to various embodiments, along with devices and systems that include them, have been described. Although various embodiments have been described, it will be evident that additional various modifications and changes may be made to these embodiments. Accordingly, the specification and drawings are to be regarded as illustrative rather than in a restrictive sense.

The accompanying drawings that form a part hereof, show by way of illustration, and not of limitation, various embodiments in which the subject matter may be practiced. The various embodiments illustrated are described in sufficient detail to enable those skilled in the art to practice the teachings disclosed herein. Other additional embodiments may be utilized and derived therefrom, such that structural and logical substitutions and changes may be made without departing from the scope of this disclosure. This Detailed Description, therefore, is not to be taken in any limiting sense, and the scope of various embodiments is defined only by the appended claims, along with the full range of equivalents to which such claims are entitled.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. A method, comprising:
   applying a program voltage to a memory including applying the program voltage to a word-line coupled to the memory cell;
   determining whether a threshold voltage associated with the memory cell has reached a particular pre-program verify voltage; and
   incrementing a voltage applied to a digit-line coupled to the memory cell at least twice responsive to determining that the threshold voltage has reached the particular pre-program verify voltage.

2. The method of claim 1, wherein the applying further comprises:
   applying a series of program voltage pulses having incrementally increasing pulse heights and substantially same pulse widths.

3. The method of claim 1, wherein the applying further comprises:
   applying the program voltage as an increasing program voltage after determining that the threshold voltage has reached the pre-program verify voltage.

4. The method of claim 1, further comprising:
   applying the program voltage to cause the threshold voltage associated with the memory cell to increase during at least a portion of the particular pre-program verify stage.

5. The method of claim 1, wherein the determining further comprises:
   sensing the memory cell and comparing content of the memory cell with a desired value.

6. The method of claim 1, wherein the value of the particular pre-program verify is smaller than a program verify voltage associated with a threshold voltage that is within a target threshold voltage distribution width of the memory cell.

7. The method of claim 1, wherein the determining further comprises:

determining that the threshold voltage associated with the memory cell has reached a value of the pre-program verify that is smaller than a program verify voltage associated with a measured value of a drain current of the memory cell.

8. A method, comprising:
applying a program voltage to a memory;
determining whether a threshold voltage associated with the memory cell has reached a particular pre-program verify voltage; and
incrementing a voltage applied to a digit-line coupled to the memory cell at least twice responsive to determining that the threshold voltage has reached the particular pre-program verify voltage; and
increasing the program voltage as an applied voltage to some other ones of the number of memory cells coupled to a word-line during an inhibit phase of the voltage applied to the digit-line of the memory cell.

9. A method, comprising:
applying a program voltage to a memory;
determining whether a threshold voltage associated with the memory cell has reached a particular pre-program verify voltage; and
incrementing a voltage applied to a digit-line coupled to the memory cell at least twice responsive to determining that the threshold voltage has reached the particular pre-program verify voltage, wherein the incrementing further comprises incrementing the voltage applied to the digit-line in approximately similar step height value increments.

10. A method, comprising:
applying a program voltage to a memory;
determining whether a threshold voltage associated with the memory cell has reached a particular pre-program verify voltage;
incrementing a voltage applied to a digit-line coupled to the memory cell at least twice responsive to determining that the threshold voltage has reached the particular pre-program verify voltage; and
increasing the voltage applied to the digit-line to an inhibit level after the threshold voltage associated with the memory cell has reached a selected program verify voltage.

11. An apparatus, comprising:
an array of memory cells; and
control circuitry coupled to the memory array to control programming of the memory cells, the control circuitry configured to implement a method, comprising:
  applying a program voltage to the array;
  determining whether a threshold voltage associated with a memory cell has reached a particular pre-program verify voltage; and
  incrementing a voltage applied to a digit-line coupled to the memory cell at least twice responsive to determining that the threshold voltage has reached the particular pre-program verify voltage.

12. The apparatus of claim 11, wherein the memory device comprises:
a flash memory device, and wherein the number of memory cells comprises a number of multi-level memory cells.

13. The apparatus of claim 12, wherein each level of the number of multi-level memory cells corresponds to a stored state associated with a corresponding threshold voltage distribution width.

14. The apparatus of claim 11, wherein the control circuitry is configured to apply the program voltage to increase threshold voltages associated with a number of memory cells coupled to an access line of the array, including the threshold voltage associated with the memory cell, after determining that the threshold voltage has reached the particular pre-program verify voltage.

15. The apparatus of claim 11, wherein the control circuitry is configured to apply a series of program voltage pulses having different pulse heights and approximately equivalent pulse widths.

16. The apparatus of claim 11, wherein the control circuitry is configured to compare a content of the memory cell against a desired program verify value.

17. The apparatus of claim 11, wherein the control circuitry is configured to increase the threshold voltage as an approximate fraction of the program voltage after determining that the threshold voltage has reached the pre-program verify voltage.

18. The apparatus of claim 11, wherein the control circuitry is configured to operate such that the threshold voltage increases as a decreasing portion of the program voltage after determining that the threshold voltage has reached the pre-program verify voltage.

19. The apparatus of claim 11, wherein the control circuitry is configured to increment the voltage applied to the digit-line coupled to the memory cell in substantially identical step height values after determining that the threshold voltage has reached the pre-program verify voltage.

20. The apparatus of claim 11, wherein the control circuitry is configured to increase the voltage applied to the digit-line of the memory cell to an inhibit level after the threshold voltage associated with the memory cell has reached a program verify voltage and while the program voltage continues to increase.

21. The apparatus of claim 11, wherein the array of multi-level memory cells comprises:
a flash memory arranged in at least one of a NAND-type configuration, or an OR-type configuration.

22. A method, comprising:
applying a program voltage to a word-line of multiple word-lines in an array of nonvolatile multi-level memory cells arranged in rows coupled to the word-lines and columns coupled to bit-lines, the program voltage applied to increase a threshold voltage associated with a memory cell coupled to the word-line;
determining whether the threshold voltage has reached a particular pre-program verify voltage smaller than a program verify voltage; and
incrementing a voltage applied to a bit-line of the BLs that is coupled to the memory cell until the threshold voltage reaches the program verify voltage and without determining whether the threshold voltage has reached a voltage between the particular pre-program verify and the program verify.

23. A method, comprising:
applying a number of program voltage pulses including a number of pulses having incrementally increasing pulse heights to a word-line of a number of word-lines of an array of memory cells in a flash memory device, the increasing pulse heights serving to increase a threshold voltage associated with memory cells coupled to the word-line;
determining whether the threshold voltage has reached a pre-program verify voltage smaller than a program verify voltage, the program verify voltage comprising a voltage associated with the threshold voltage that corresponds to a stored state of the memory cell;

incrementing at least twice within a single pre-program verify stage, a voltage applied to a bit-line coupled to the memory cell, responsive to the determining;

verifying that the threshold voltage has reached the program verify voltage; and holding the voltage applied to the bit-line at an inhibit voltage responsive to reaching the program verify voltage.

* * * * *